United States Patent [19]
Hamasaki et al.

[11] Patent Number: 5,856,799
[45] Date of Patent: Jan. 5, 1999

[54] ROTATION SYSTEM FOR CORRECTION OF WEIGHTING ELEMENT ERRORS IN DIGITAL-TO-ANALOG CONVERTER

[75] Inventors: Toshihiko Hamasaki, Yokohama; Yoshiaki Shinohara, Tokyo; Toshio Murota, Kanagawa; Ei-ichi Arihara, Kawasaki; Kyoji Matsusako, Kanagawa, all of Japan

[73] Assignee: Burr-Brown Corporation, Tucson, Ariz.

[21] Appl. No.: 496,427

[22] Filed: Jun. 29, 1995

[30] Foreign Application Priority Data

Aug. 16, 1994 [JP] Japan ................................. 6-192568

[51] Int. Cl.[6] .................................................. H03M 1/66
[52] U.S. Cl. ........................................... 341/144; 341/118
[58] Field of Search ..................................... 341/118, 126, 341/144, 153

[56] References Cited

U.S. PATENT DOCUMENTS

| | | | |
|---|---|---|---|
| 3,588,882 | 6/1971 | Propster | 340/347 |
| 4,125,803 | 11/1978 | van de Plassche | 323/1 |
| 4,703,310 | 10/1987 | van de Plassche | 340/347 |
| 4,791,406 | 12/1988 | Mehrgardt et al. | 341/144 |
| 4,833,473 | 5/1989 | Dingwall | 341/154 |
| 4,935,740 | 6/1990 | Schouwenhaars et al. | 341/135 |
| 4,947,169 | 8/1990 | Smith et al. | 341/121 |
| 5,404,142 | 4/1995 | Adams et al. | 341/144 |
| 5,534,863 | 7/1996 | Everitt et al. | 341/150 |

OTHER PUBLICATIONS

"A Multi–Bit ΣΔ DAC with Dynamic Element Matching Techniques", by Feng Chen and Bosco Leung, IEEE 1992 Custom Integrated Circuits Conference, pp. 16.2.1–16.2.4.

"A 16–BIT 4th Order Noise–Shaping D/A Converter", by L. Richard Carley and John Kenney, IEEE 1988 Conference, pp. 21.7.1–21.7.4.

*Primary Examiner*—Jeffrey A. Gaffin
*Attorney, Agent, or Firm*—Cahill, Sutton & Thomas P.L.C.

[57] ABSTRACT

A digital-to-analog converter is provided which compensates for relative errors among weighting elements used for D/A conversion. The converter includes a decoder, a rotator, and a weighting section. The rotator receives decoded signals from a decoder to produce rotated output signals for activating or deactivating a plurality of weighting elements, respectively, included in the weighting section. The rotated output signals assure that the same number of weighting elements are activated in each of a plurality of sub-periods of time constituting a main period of time of the D/A conversion and that each of the plurality of weighting elements is activated the same number of times during the whole main period.

20 Claims, 21 Drawing Sheets

FIG. 5

CASE OF
S = (0 0 0), A = 0, b = 1, M = 4

|  | Tm | | | |
|---|---|---|---|---|
|  | Tsub1 | Tsub2 | Tsub3 | Tsub4 |
| n1 | 0 | 0 | 0 | 0 |
| n2 | 0 | 0 | 0 | 0 |
| n3 | 0 | 0 | 0 | 0 |
| n4 | 0 | 0 | 0 | 0 |
| p1 | 1 | 1 | 1 | 1 |
| p2 | 1 | 1 | 1 | 1 |
| p3 | 1 | 1 | 1 | 1 |
| p4 | 1 | 1 | 1 | 1 |

FIG. 6

CASE OF
S = ( 0 1 0 ) , A = 2 , b = 1 , M = 4

|  | Tm | | | |
|---|---|---|---|---|
|  | Tsub1 | Tsub2 | Tsub3 | Tsub4 |
| n1 | 0 | 0 | 1 | 1 |
| n2 | 0 | 1 | 1 | 0 |
| n3 | 1 | 1 | 0 | 0 |
| n4 | 1 | 0 | 0 | 1 |
| p1 | 1 | 1 | 0 | 0 |
| p2 | 1 | 0 | 0 | 1 |
| p3 | 0 | 0 | 1 | 1 |
| p4 | 0 | 1 | 1 | 0 |

FIG. 7

CASE OF
S = (1 0 0), A = 4, b = 1, M = 4

| | Tm | | | |
|---|---|---|---|---|
| | Tsub1 | Tsub2 | Tsub3 | Tsub4 |

| | | | | |
|---|---|---|---|---|
| n1 | 1 | 1 | 1 | 1 |
| n2 | 1 | 1 | 1 | 1 |
| n3 | 1 | 1 | 1 | 1 |
| n4 | 1 | 1 | 1 | 1 |
| p1 | 0 | 0 | 0 | 0 |
| p2 | 0 | 0 | 0 | 0 |
| p3 | 0 | 0 | 0 | 0 |
| p4 | 0 | 0 | 0 | 0 |

EACH OF ALL ELEMENTS IS ACTIVATED THE SAME NUMBER OF TIMES IN A MAIN PERIOD ACCORDING TO PRESENT INVENTION.

| | | $T_m$ | | | | |
|---|---|---|---|---|---|---|
| | | $T_{sub1}$ | $T_{sub2}$ | $T_{sub3}$ | $T_{sub4}$ | |
| S=(000) | n1 | 0 | 0 | 0 | 0 | |
| | n2 | 0 | 0 | 0 | 0 | TOTAL AVERAGE IN $T_m$ |
| | n3 | 0 | 0 | 0 | 0 | |
| | n4 | 0 | 0 | 0 | 0 | 0 |
| S=(001) | n1 | 0 | 0 | 0 | $1-2\delta$ | |
| | n2 | 0 | 0 | $1-\delta$ | 0 | TOTAL AVERAGE IN $T_m$ |
| | n3 | 0 | $1+\delta$ | 0 | 0 | |
| | n4 | $1+2\delta$ | 0 | 0 | 0 | 1 |
| S=(010) | n1 | 0 | 0 | $1-2\delta$ | $1-2\delta$ | |
| | n2 | 0 | $1-\delta$ | $1-\delta$ | 0 | TOTAL AVERAGE IN $T_m$ |
| | n3 | $1+\delta$ | $1+\delta$ | 0 | 0 | |
| | n4 | $1+2\delta$ | 0 | 0 | $1+2\delta$ | 2 |
| S=(011) | n1 | 0 | $1-2\delta$ | $1-2\delta$ | $1-2\delta$ | |
| | n2 | $1-\delta$ | $1-\delta$ | $1-\delta$ | 0 | TOTAL AVERAGE IN $T_m$ |
| | n3 | $1+\delta$ | $1+\delta$ | 0 | $1+\delta$ | |
| | n4 | $1+2\delta$ | 0 | $1+2\delta$ | $1+2\delta$ | 3 |
| S=(100) | n1 | $1-2\delta$ | $1-2\delta$ | $1-2\delta$ | $1-2\delta$ | |
| | n2 | $1-\delta$ | $1-\delta$ | $1-\delta$ | $1-\delta$ | TOTAL AVERAGE IN $T_m$ |
| | n3 | $1+\delta$ | $1+\delta$ | $1+\delta$ | $1+\delta$ | |
| | n4 | $1+2\delta$ | $1+2\delta$ | $1+2\delta$ | $1+2\delta$ | 4 |

FIG. 10

EACH OF ALL ELEMENTS IS NOT ACTIVATED THE SAME
NUMBER OF TIMES IN A MAIN PERIOD ACCORDING TO PRIOR ART.

| | | Tm | | | | |
|---|---|---|---|---|---|---|
| | | Tsub1 | Tsub2 | Tsub3 | Tsub4 | |
| S=(000) | n1 | 0 | 0 | 0 | 0 | |
| | n2 | 0 | 0 | 0 | 0 | TOTAL AVERAGE IN Tm |
| | n3 | 0 | 0 | 0 | 0 | |
| | n4 | 0 | 0 | 0 | 0 | 0 |
| S=(001) | n1 | 0 | 0 | 0 | $1-2\delta$ | |
| | n2 | $1-\delta$ | 0 | $1-\delta$ | 0 | TOTAL AVERAGE IN Tm |
| | n3 | 0 | $1+\delta$ | 0 | 0 | |
| | n4 | 0 | 0 | 0 | 0 | $1-(3/4)\delta$ |
| S=(010) | n1 | 0 | $1-2\delta$ | $1-2\delta$ | $1-2\delta$ | |
| | n2 | 0 | $1-\delta$ | $1-\delta$ | 0 | TOTAL AVERAGE IN Tm |
| | n3 | $1+\delta$ | 0 | 0 | 0 | |
| | n4 | $1+2\delta$ | 0 | 0 | $1+2\delta$ | $2-(3/4)\delta$ |
| S=(011) | n1 | 0 | $1-2\delta$ | $1-2\delta$ | $1-2\delta$ | |
| | n2 | $1-\delta$ | $1-\delta$ | 0 | 0 | TOTAL AVERAGE IN Tm |
| | n3 | $1+\delta$ | $1+\delta$ | $1+\delta$ | $1+\delta$ | |
| | n4 | $1+2\delta$ | 0 | $1+2\delta$ | $1+2\delta$ | $3+(2/4)\delta$ |
| S=(100) | n1 | $1-2\delta$ | $1-2\delta$ | $1-2\delta$ | $1-2\delta$ | |
| | n2 | $1-\delta$ | $1-\delta$ | $1-\delta$ | $1-\delta$ | TOTAL AVERAGE IN Tm |
| | n3 | $1+\delta$ | $1+\delta$ | $1+\delta$ | $1+\delta$ | |
| | n4 | $1+2\delta$ | $1+2\delta$ | $1+2\delta$ | $1+2\delta$ | 4 |

CASE OF
S = (0 0 0), A = 0, b = 1, M = 4

| | Tm | | | |
|---|---|---|---|---|
| | Tsub1 | Tsub2 | Tsub3 | Tsub4 |

| | | | | |
|---|---|---|---|---|
| n1 | 0 | 0 | 0 | 0 |
| n2 | 0 | 0 | 0 | 0 |
| n3 | 0 | 0 | 0 | 0 |
| n4 | 0 | 0 | 0 | 0 |
| n5 | 1 ⟶ | 0 ⟶ | 1 ⟶ | 0 |
| n6 | 0 ⟶ | 1 ⟶ | 0 ⟶ | 1 |
| p1 | 1 | 1 | 1 | 1 |
| p2 | 1 | 1 | 1 | 1 |
| p3 | 1 | 1 | 1 | 1 |
| p4 | 1 | 1 | 1 | 1 |
| p5 | 0 ⟶ | 1 ⟶ | 0 ⟶ | 1 |
| p6 | 1 ⟶ | 0 ⟶ | 1 ⟶ | 0 |

FIG. 14

CASE OF
S = (0 1 0), A = 2, b = 1, M = 4

|  | Tm | | | |
|---|---|---|---|---|
|  | Tsub1 | Tsub2 | Tsub3 | Tsub4 |

| | | | | |
|---|---|---|---|---|
| n1 | 0 | 0 ⟶ 1 | | 1 |
| n2 | 0 ⟶ 1 | | 1 ⟶ 0 | |
| n3 | 1 | 1 ⟶ 0 | | 0 |
| n4 | 1 ⟶ 0 | | 0 ⟶ 1 | |
| n5 | 0 | 0 | 0 | 0 |
| n6 | 1 | 1 | 1 | 1 |
| p1 | 1 | 1 ⟶ 0 | | 0 |
| p2 | 1 ⟶ 0 | | 0 ⟶ 1 | |
| p3 | 0 | 0 ⟶ 1 | | 1 |
| p4 | 0 ⟶ 1 | | 1 ⟶ 0 | |
| p5 | 0 | 0 | 0 | 0 |
| p6 | 1 | 1 | 1 | 1 |

FIG. 15

CASE OF
S = (1 0 0), A = 4, b = 1, M = 4

| | Tm | | | |
|---|---|---|---|---|
| | Tsub1 | Tsub2 | Tsub3 | Tsub4 |

| | Tsub1 | Tsub2 | Tsub3 | Tsub4 |
|---|---|---|---|---|
| n1 | 1 | 1 | 1 | 1 |
| n2 | 1 | 1 | 1 | 1 |
| n3 | 1 | 1 | 1 | 1 |
| n4 | 1 | 1 | 1 | 1 |
| n5 | 1 ⟶ | 0 ⟶ | 1 ⟶ | 0 |
| n6 | 0 ⟶ | 1 ⟶ | 0 ⟶ | 1 |
| p1 | 0 | 0 | 0 | 0 |
| p2 | 0 | 0 | 0 | 0 |
| p3 | 0 | 0 | 0 | 0 |
| p4 | 0 | 0 | 0 | 0 |
| p5 | 0 ⟶ | 1 ⟶ | 0 ⟶ | 1 |
| p6 | 1 ⟶ | 0 ⟶ | 1 ⟶ | 0 |

CASE OF
S = (0 0 1), A = 1, b = 2, M = 4

| | Tm | | | | | | | |
|---|---|---|---|---|---|---|---|---|
| | Tsub1 | Tsub2 | Tsub3 | Tsub4 | Tsub5 | Tsub6 | Tsub7 | Tsub8 |
| n1 | 1 | 0 | 0 | 0 | 1 | 0 | 0 | 0 |
| n2 | 0 | 1 | 0 | 0 | 0 | 1 | 0 | 0 |
| n3 | 0 | 0 | 1 | 0 | 0 | 0 | 1 | 0 |
| n4 | 0 | 0 | 0 | 1 | 0 | 0 | 0 | 1 |
| p1 | 0 | 1 | 1 | 1 | 0 | 1 | 1 | 1 |
| p2 | 1 | 0 | 1 | 1 | 1 | 0 | 1 | 1 |
| p3 | 1 | 1 | 0 | 1 | 1 | 1 | 0 | 1 |
| p4 | 1 | 1 | 1 | 0 | 1 | 1 | 1 | 0 |

FIG. 20

ROTATION SYSTEM FOR CORRECTION OF WEIGHTING ELEMENT ERRORS IN DIGITAL-TO-ANALOG CONVERTER

BACKGROUND OF THE INVENTION

1. Field of the Invention

The present invention relates to a digital-to-analog converter for converting a digital input signal to an analog output signal.

2. Description of The Prior Art

Known digital-to-analog converters have been configured in such a manner that a summer employing a differential amplifier circuit is provided to produce the sum of the outputs of unit weighting elements each of which comprises a capacitor. An example thereof has been reported, for example, in "A Multi-Bit ΣΔ DAC with Dynamic Element Matching Techniques", Feng Chen and Bosco Leung, Proc. IEEE 1992 Custom Integrated Circuits Conference, pp. 16.2.1–16.2.4. In the digital-to-analog converter described therein, a binary digital code is converted to a decimal analog value. Within substantially equal capacitors, serving as the weighting elements, provided in the converter, a number of capacitors corresponding in number to the decimal analog value are used through Metal-Oxide-Semiconductor (MOS) transistor switches such that a summer produces an analog quantity. Further, an approach has been proposed in order to prevent the linearity of the converter from being damaged due to minute errors in capacitance among the capacitors. In the approach, different combinations of used capacitors are dynamically selected one after another during a period of time (i.e. a main period of time) in which a digital code is converted to an analog quantity, such that outputs from the respective capacitors are averaged.

Even with the design as mentioned above, the digital-to-analog converter still has a critical disadvantage that MOS transistors required to be provided in respective feedback loops within the summer leave in the channels of the transistors, upon switching, stored charges the amount of which are non-linear with respect to the output voltage of the summer. As a result, the linearity as well as the immunity to noise including harmonic distortion is adversely affected thereby causing a deterioration in performance.

Digital-to-analog converters may produce output signals in the form of current other than the above-mentioned voltage. An example is the digital-to-analog converter disclosed in Japanese Patent Appln. Public-Disclosure No. 1-204527. This performs digital-to-analog conversion using, as weighting elements, unit current sources which are substantially equal to each other. An approach has been proposed in order to prevent the analog performance of the converter from being damaged due to minute errors among the respective current sources. The approach dynamically selects different combinations of used current sources one after another during a period of time, i.e. a main period of time in which a digital code is converted to an analog quantity, thereby averaging errors among the outputs of the unit current sources.

The most important performance factor for the converter characteristics of digital-to-analog converters is the equality or matching of devices which constitute respective unit weighting elements used in summation. Although the above-mentioned conventional approaches have been proposed to improve the performance factor, the linearity and the noise immunity realized thereby are still insufficient due to a problem with the operation principle of the respective devices and due to a problem with the averaging techniques. Further, both examples involve a problem that the linearity of the output analog quantity deteriorates when the output analog value changes between a main period and the subsequent main period.

SUMMARY OF THE INVENTION

It is therefore an object of the present invention to provide a digital-to-analog converter which improves the linearity and the noise immunity characteristics.

It is another object of the present invention to provide the above-mentioned digital-to-analog converter at a low cost.

To achieve the above objects, a digital-to-analog converter is provided according to the present invention which converts a digital input signal to an analog output signal corresponding thereto in each main period of time which is divided into a plurality of sub-periods of time, said converter comprising: a) an input terminal for receiving said digital input signal; b) an output terminal for producing said analog output signal; c) weighting means including a plurality of weighting elements, each of said weighting elements being activated or deactivated by a weighting element control signal received thereby to produce a weighted output; d) combination means adapted to receive a plurality of said weighted outputs from said plurality of weighting elements of said weighing means for combining said plurality of weighted outputs to supply said analog output signal to said output terminal; e) decoder means for decoding said digital input signal received at said input terminal to produce a plurality of decoded signals, said plurality of decoded signals being operative to determine a combination of a number of weighting elements to be activated and a number of weighting elements to be deactivated within said plurality of weighting elements required to form said analog output signal; and f) rotator means connected to receive said plurality of decoded signals for producing a plurality of weighting element control signals from said plurality of decoded signals, said plurality of weighting element control signals being operative to activate or deactivate said plurality of weighting elements, respectively, in such a manner that the same number of weighting elements are activated in each of said plurality of sub-periods constituting a given main period and that each of said plurality of weighting elements is activated the same number of times during said given main period.

With this configuration, the number of times each of the plurality of weighting elements is activated is the same in each main period. Stated another way, the number of times all of the plurality of weighting elements are activated depends on the digital input signal in an associated main period, and consequently, a combination of weighting elements to be averaged is made unchanged between any main period and a subsequent main period, thus contributing to an improvement in the linearity of the converter.

Also, according to the present invention, a number M of said plurality of weighting elements may be equal to a maximum decimal value A represented by said digital input signal, and a number of said plurality of sub-periods constituting said main period may be equal to b×M, where b is a positive integer. In this case, when said b is equal to two or more, said rotator means may repetitively produce said plurality of weighting element control signals produced in a first M number of sub-periods within a b×M number of sub-periods constituting said main period, in subsequent each M number of sub-periods. In this way, as the value of b is larger, that is, as the number of rotations is greater, the effect of the averaging in the main period is enhanced. This also contributes to an improvement in the linearity of the converter.

Also, according to the present invention, when said plurality of weighting elements of said weighting means are connected to a common power supply, said digital-to-analog converter may further include dummy means connected to receive said decoded signals from said decode means, said dummy means comprises: a) a plurality of dummy weighting elements connected to said common power supply; and b) dummy control signal generator means connected to receive said decoded signals for generating in response thereto dummy weighting element control signals, said dummy weighting element control signals being operative to activate or deactivate said plurality of dummy weighting elements, respectively, in such a manner that a sum of a number of activated ones within said plurality of weighting elements and a number of activated ones within said plurality of dummy weighting elements is equal to a predetermined constant value over the whole period of digital-to-analog conversion. In this way, when each weighting element influences the common power supply to some degree when activated, the total degree of the influence exerted on the common power supply is made substantially constant over the whole period of digital-to-analog conversion. Likewise, this contributes to an improvement in the linearity of the converter.

Also, according to the present invention, each of the weighting elements may include a CMOS inverter which receives the weighting element control signal and a resistor having an end connected to an output of the inverter and the other end for producing the weighted output. Further, each of the dummy weighting elements may include a CMOS inverter which receives the dummy weighting control signal and a resistor having an end connected to an output of the inverter and the other end being open-circuited or in unconnected state. By using CMOS inverters requiring low power dissipation for the weighting elements, the influence of the CMOS converters exerting on peripheral supply voltages, i.e., fluctuations in supply voltages can be reduced, and also the equality of the switching characteristics of the inverters (for example, switching time, load driving capability and dynamic output impedance) is enhanced. This also improves the linearity of the converter.

Also, according to the present invention, each of the dummy weighting elements may include a CMOS inverter which receives the dummy weighting element control signal, and an output of the inverter may be open-circuited or in unconnected state in direct current. By doing so, a certain degree of improvement can also be imparted to the linearity of the converter. (This is because the other ends of the above mentioned resistors are originally open-circuited, the influence of the resistors as loads is relatively small, and therefore no greatly different dynamic output impedance results. Thus, when the converter is implemented in an integrated circuit, a chip area required to form the resistors can be removed, while a required performance of the digital-to-analog converter can be realized.)

Next, the present invention may also be applied to a differential type digital-to-analog converter. Specifically, according to the present invention, a digital-to-analog converter for converting a digital input signal to an analog output signal corresponding thereto in each main period which is divided into a plurality of sub-periods, comprises: a) an input terminal for receiving said digital input signal; b) an output terminal for producing said analog output signal; c) weighting means including a first set of weighting elements comprising a first plural number of weighting elements and a second set of weighting elements comprising a second plural number of weighting elements, each said weighting element being activated or deactivated by a weighting element control signal received thereby to produce a weighted output; d) combination means having a first input for receiving a first set of said weighted outputs from said first set of weighing elements of said weighting means, and a second input for receiving a second set of said weighted outputs from said second set of weighting elements of said weighting means, said combination means being operative to differentially combining said first set of weighted outputs and said second set of weighted outputs to supply said analog output signal to said output terminal; e) decode means for decoding said digital input signal received at said input terminal to produce a plurality of decoded signals, said plurality of decoded signals being operative to determine a combination of a number of weighting elements to be activated and a number of weighting elements to be deactivated within said plurality of weighting elements required to form said analog output signal; and f) rotator means connected to receive said plurality of decoded signals for producing a first set of a plurality of weighting element control signals for activating or deactivating said first set of weighting elements, respectively, and a second set of a plurality of weighting element control signals for activating or deactivating said second set of weighting elements, respectively, each of said first and second sets of said weighting element control signals being adapted such that the same number of weighting elements in an associated set of weighting elements are activated in each of said plurality of sub-periods constituting a given main period and that each of said plurality of weighting elements in the associated set is activated the same number of times during said given main period.

Also, according to the present invention, said first and second sets of weighting elements of said weighting means may be connected to a common power supply, and said digital-to-analog converter may further include dummy means connected to receive said decoded signals from said decode means, said dummy means comprises: a) a first set of dummy weighting elements comprising a plurality of dummy weighting elements connected to said common power supply, and a second set of dummy weighting elements comprising a plurality of dummy weighting elements connected to said common power supply; and b) dummy control signal generator means connected to receive said decoded signals for generating in response thereto a first set of dummy weighting element control signals for activating or deactivating said first set of dummy weighting elements, respectively, and a second set of dummy weighting element control signals for activating or deactivating said second set of dummy weighting elements, respectively, said first and second sets of dummy weighting element control signals being adapted such that a sum of a number of activated ones within said first set of weighting elements of said weighting means and a number of activated ones within said first set of dummy weighting elements is equal to a predetermined constant value over the whole period of digital-to-analog conversion and that a sum of a number of activated ones within said second set of weighting elements of said weighting means and a number of activated ones within said second set of dummy weighting elements is equal to a predetermined constant value over the whole period of the digital-to-analog conversion.

Also, according to the present invention, each of the weighting elements and the dummy weighting elements may include a CMOS inverter and a resistor having an end connected to an output of the inverter. Further, the combination means may comprises an operational amplifier having an inverting input forming the first input, a non-inverting input forming the second input, and an output connected to the output terminal, and the digital-to-analog converter may include an output-impedance matching circuit connected between the output terminal and the outputs of the CMOS inverters included in the first and second sets of weighting elements. The output impedance matching circuit matches an output impedance of a plurality of CMOS inverters constituting the first set of weighting elements with an output impedance of a plurality of CMOS inverters constituting the second set of weighting elements. This enhances the equality or uniformity of the weighting elements, and thus contributes to an improvement in the linearity of the converter.

Furthermore, according to the present invention, each of the weighting elements may be of a voltage source type or of a current source type. Thus, the present invention can be applied to a variety of different types of digital-to-analog converters.

BRIEF DESCRIPTION OF THE DRAWINGS

The present invention will hereinafter be explained in connection with the preferred embodiments with reference to the accompanying drawings:

FIG. 5 is a table showing patterns of rotated bit outputs produced by the bit rotator circuit shown in FIG. 4 wherein the number of weighting elements M is equal to four (M=4), the number of rotations b being one (b=1), a digital input signal S being (000) (S=(000)), and its decimal value A being equal to zero (A=0);

FIG. 6 is a table similar to FIG. 5 in the case of M=4, b=1, S=(010) and A=2;

FIG. 7 is a table similar to FIG. 5 in the case of M=4, b=1, S=(100) and A=4;

FIG. 10 is a table listing data used for calculating the characteristic of the present invention in FIG. 9;

FIG. 11 is a table listing data used for calculating the characteristic of the prior art example in FIG. 9;

FIG. 13 is a table showing patterns of rotated bit outputs produced by the bit rotator circuit shown in FIG. 12 wherein the number of weighting elements M is equal to four (M=4), the number of rotations b being one (b=1), a digital input signal S being (000) (S=(000)), and its decimal value A being equal to zero (A=0);

FIG. 14 is a table similar to FIG. 13 in the case of M=4, b=1, S=(010) and A=2;

FIG. 15 is a table similar to FIG. 13 in the case of M=4, b=1 S=(100), and A=4;

FIG. 20 is a table showing patterns of rotated bit outputs produced when b is set to equal to 2 in the first embodiment, for the purpose of illustrating modifications to the first through fourth embodiments of the present invention.

DETAILED DESCRIPTION OF THE PREFERRED EMBODIMENTS

Figure 1:
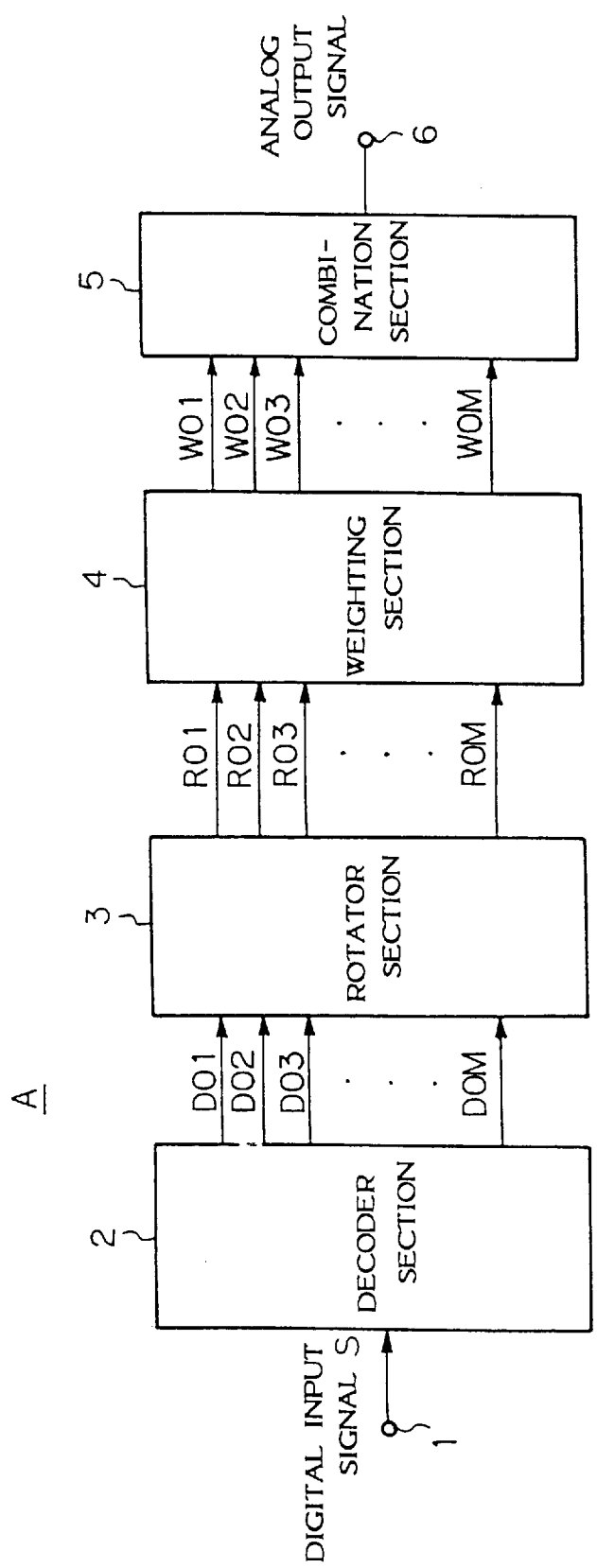
FIG. 1 is a block diagram of a digital-to-analog (D/A) converter A according to the present invention which has the basic configuration.

FIG. 1 shows the basic configuration of a digital-to-analog (D/A) converter according to the present invention. The D/A converter A is a type in which a main period of time Tm for each D/A conversion is equally divided into a plurality of sub-periods of time Tsub1–Tsubk (k is a positive integer) such that an average value of analog outputs in the respective sub-periods of the main period is produced as an analog output of the D/A converter in the main period.

Specifically, the D/A converter A includes a digital input terminal 1 to which a binary input digital signal S is applied; a decoder section 2; a rotator section 3; a weighting section 4 which includes an M number of weighting elements (M is a positive integer) designed to perform uniform weighting; a combination section 5; and an analog output terminal 6. The M weighting elements may be of a voltage source type or a current source type. Here, when a decimal maximum value represented by the binary input digital signal S is denoted by A, A≦M should be satisfied.

Stated another way, the uniform weighting, unlike binary weighting and so on, requires a number of weighting elements equal to or more than the decimal maximum value A. Also, when the number of rotations performed by the rotator section is denoted by b (positive integer), the number k of sub-periods in a main period is selected to be a value determined by k=b×M. Specifically, this is because, when a digital input signal having a value which causes a weighting element to be activated in each sub-period is applied, a b×M number of sub-periods are required in order to satisfy a condition, later explained, that "each of M weighting elements is activated the same number of times in a main period".

The binary digital input signal S applied to the input terminal 1 may be of serial or parallel form, and also may be encoded using an arbitrary form of coding. The digital input signal is applied to the decoder section 2 which performs decoding corresponding to the forms of the input signal, i.e., serial-to-parallel conversion, data conversion, ΣΔ modulation or other required conversion to produce M decoded signals D01–D0M in a form which is suitable to control the weighting section 4 at a later stage. The decoded signals determine the combination of a number of weighting elements to be activated and a number of weighting elements to be deactivated within the M weighting elements, which is required to form an analog output signal. The decoded signals are applied to the rotator section 3 which produces output signals RO1–ROM for activating or deactivating the M weighting elements, respectively. The signals RO1–M are applied to associated weighting elements respectively, to activate or deactivate the respective weighting elements in such a manner that the number of activated weighting elements are the same in each of the sub-periods Tsub1–k constituting the main period Tm and that each of the M weighting elements is activated the same number of times during the main period. Then, the M weighting elements in the weighting section 4 produce weighted outputs WO1–WOM. Each of the weighting elements produces a weighted output having a value corresponding to a uniform quantity when activated and a weighted output having a value of zero, for example, when deactivated. The weighted outputs WO1–M are applied to the combining section 5 which combines the weighted outputs with each other (for example, summation in the case of a non-differential type) to provide the result to the output terminal 6 as an analog output signal.

Referring now to FIGS. 2 through 11, a D/A converter B which is the first more specific arrangement of the basic configuration in FIG. 1, will be explained hereinafter. With the embodiment, it should be noted that since the decimal maximum value A of a three-bit digital input signal S is set to be equal to four (values 5 through 7 are not used), the number of weighting elements M is four (M=4). Also, since the number of rotations b is set to one (b=1), the number of sub-periods k is four (k=4).

Figure 2:
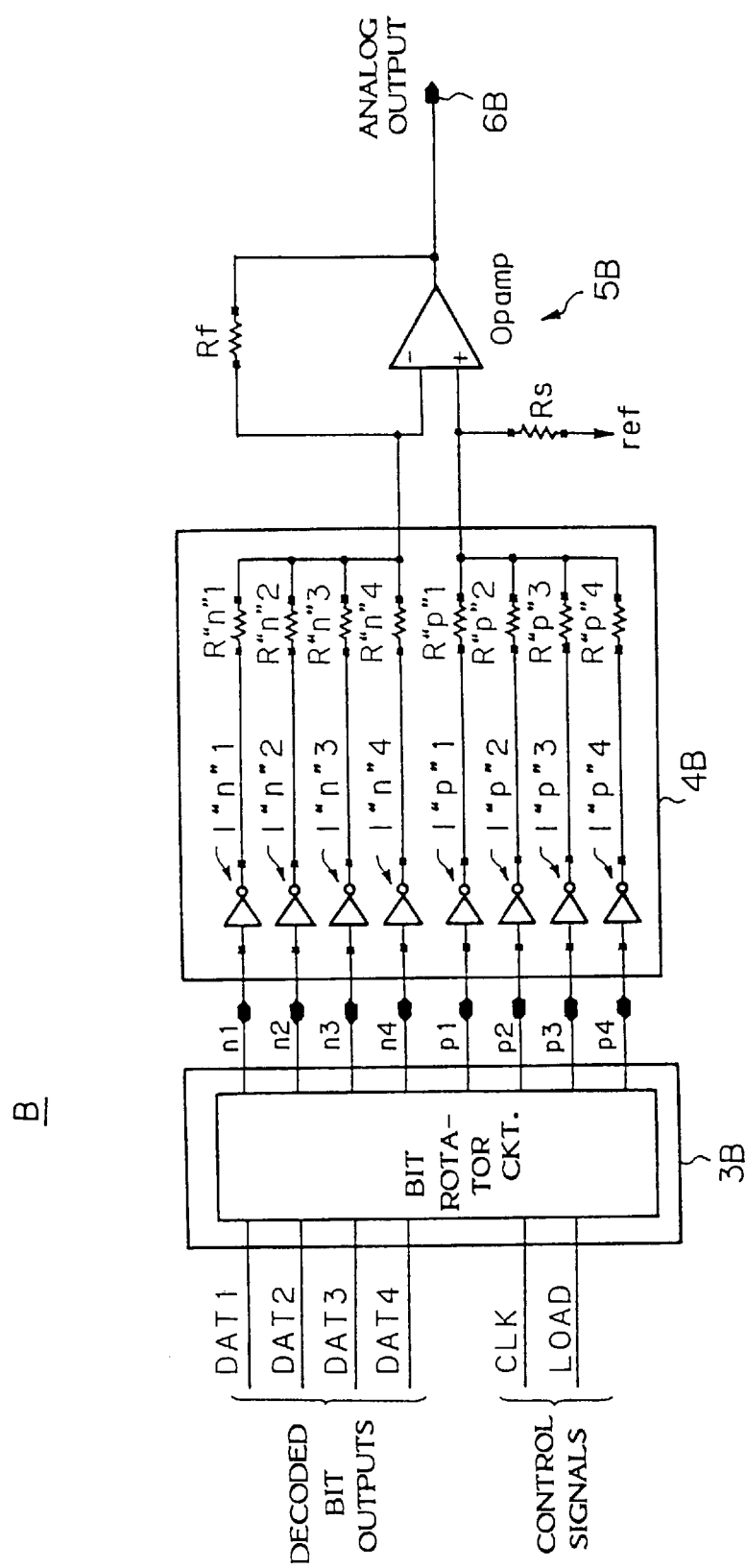
FIG. 2 is a block and schematic diagram of a D/A converter B which is the first more specific embodiment of the basic configuration shown in FIG. 1.

The D/A converter B shown in FIG. 2, which performs differential operation, includes a bit rotator circuit 3B to which outputs from a decoder (not shown) are applied; a weighting circuit section 4B which comprises weighting elements each formed of a serially coupled circuit of a CMOS inverter (I"n"1–I"n"4, I"p"1–I"p"4) and a resistor (R"n"1–R"n"4, R"p"1–R"p"4); a differential summer 5B having an inverting (n) input and a non-inverting (p) input;

and an output terminal 6B at which an analog output is produced. The inverting input of the summing circuit 5B is connected to respective outputs of the four CMOS inverter/resistor serially coupled circuits I"n"1/R"n"1–I"n"4/R"n"4, while the non-inverting input is connected to respective outputs of the four CMOS inverter/resistor serially coupled circuits I"p"1/R"p"1–I"p"4/R"p"4. For uniform weighting, the respective CMOS inverter/resistor serially coupled circuits are substantially equal to each other.

Figure 3:
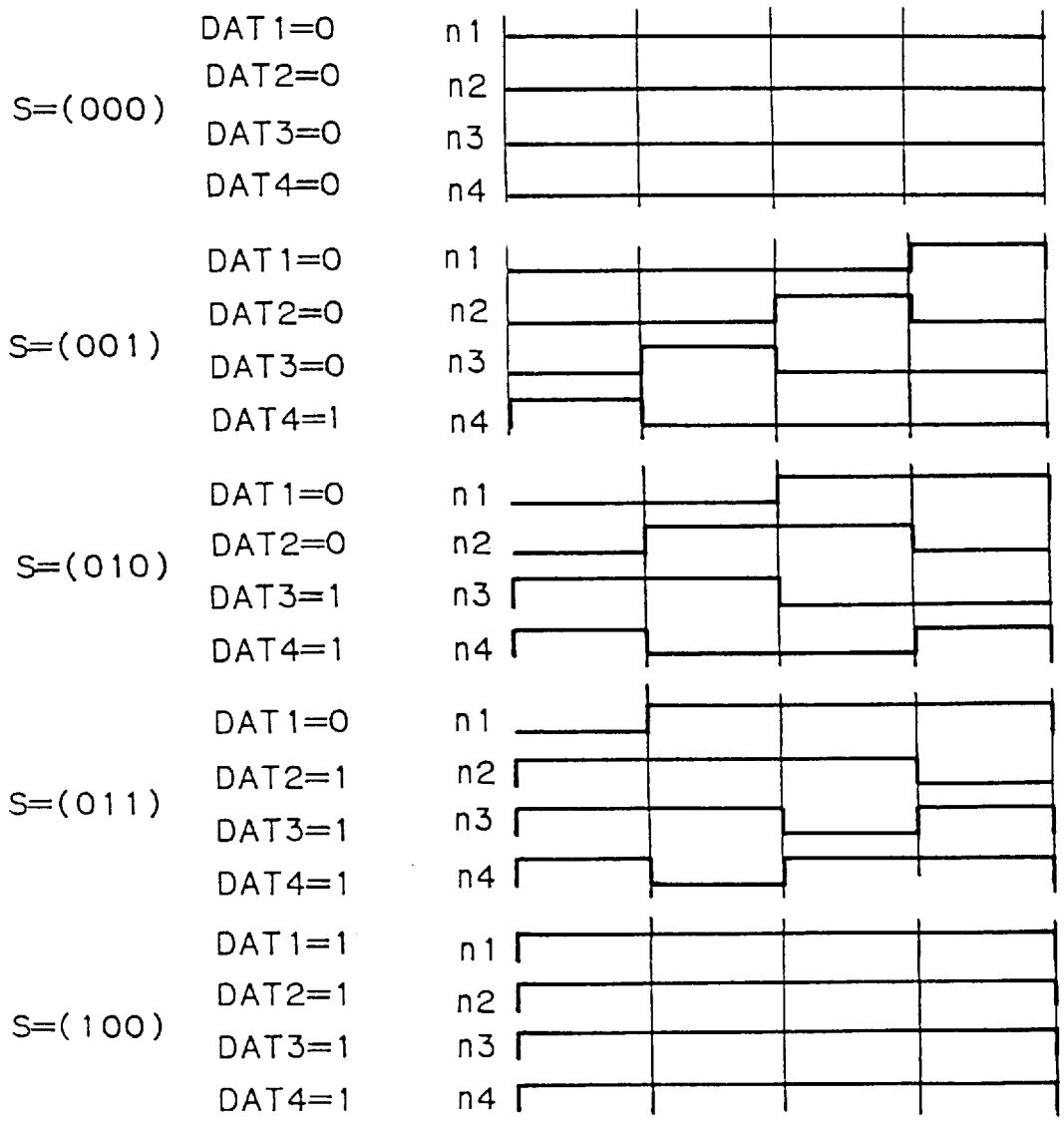
FIG. 3 is a diagram showing the waveforms of rotated bit outputs which are produced by a bit rotator circuit included in the converter shown in FIG. 2.
Figure 8:
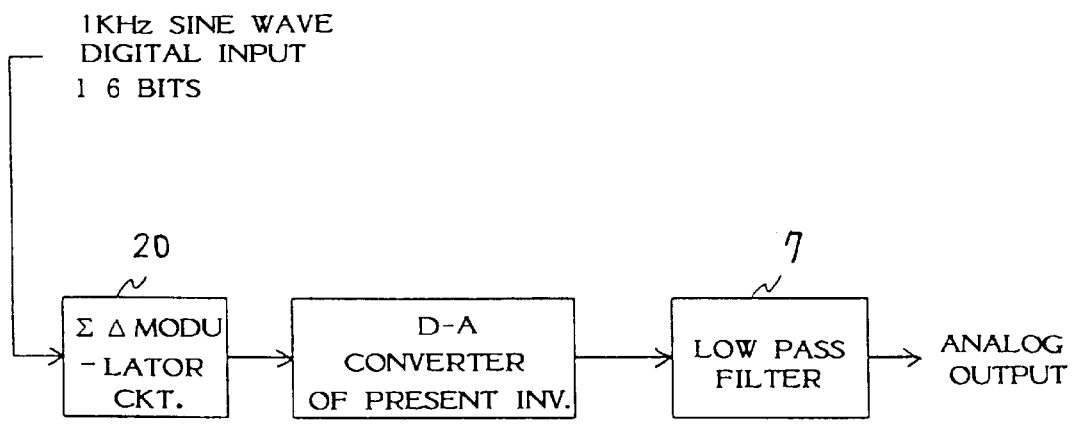
FIG. 8 is a block diagram of a digital-to-analog converter system which includes a digital-to-analog converter according to the present invention and a ΣΔ modulator circuit.

Next, the bit rotator circuit 3B receives a four-bit decoded output DAT1–4 from a decoder which is a ΣΔ modulator circuit 2 shown in FIG. 8 in the embodiment, clock signal CLK and load signal LOAD which are control signals generated within the D/A converter B. The relationship between the three-bit binary input digital signal S and the decoded bit outputs DAT1–4 is as shown in FIG. 3, wherein the number of outputs presenting "1" in the decoded bit outputs corresponds to the decimal value represented by the digital input signal S. The circuit 3B, which receives such decoded bit outputs, provides rotated bit outputs n1–n4 to four non-inverting-side nodes and rotated bit outputs p1–p4 to four inverting-side nodes during a main period Tm, as shown in FIG. 3. Note that the rotated bit outputs p1–p4 are omitted from FIG. 3, because the outputs p1–p4 are equal to the inverted versions of the respective outputs n1–n4 (for example, the output p1 is equal to the inverted version of the output n1). FIGS. 5–7 list the values of the rotated bit outputs in the cases of S=(000), (010) and (100) in the form of tables for facilitating the understanding.

Figure 4:
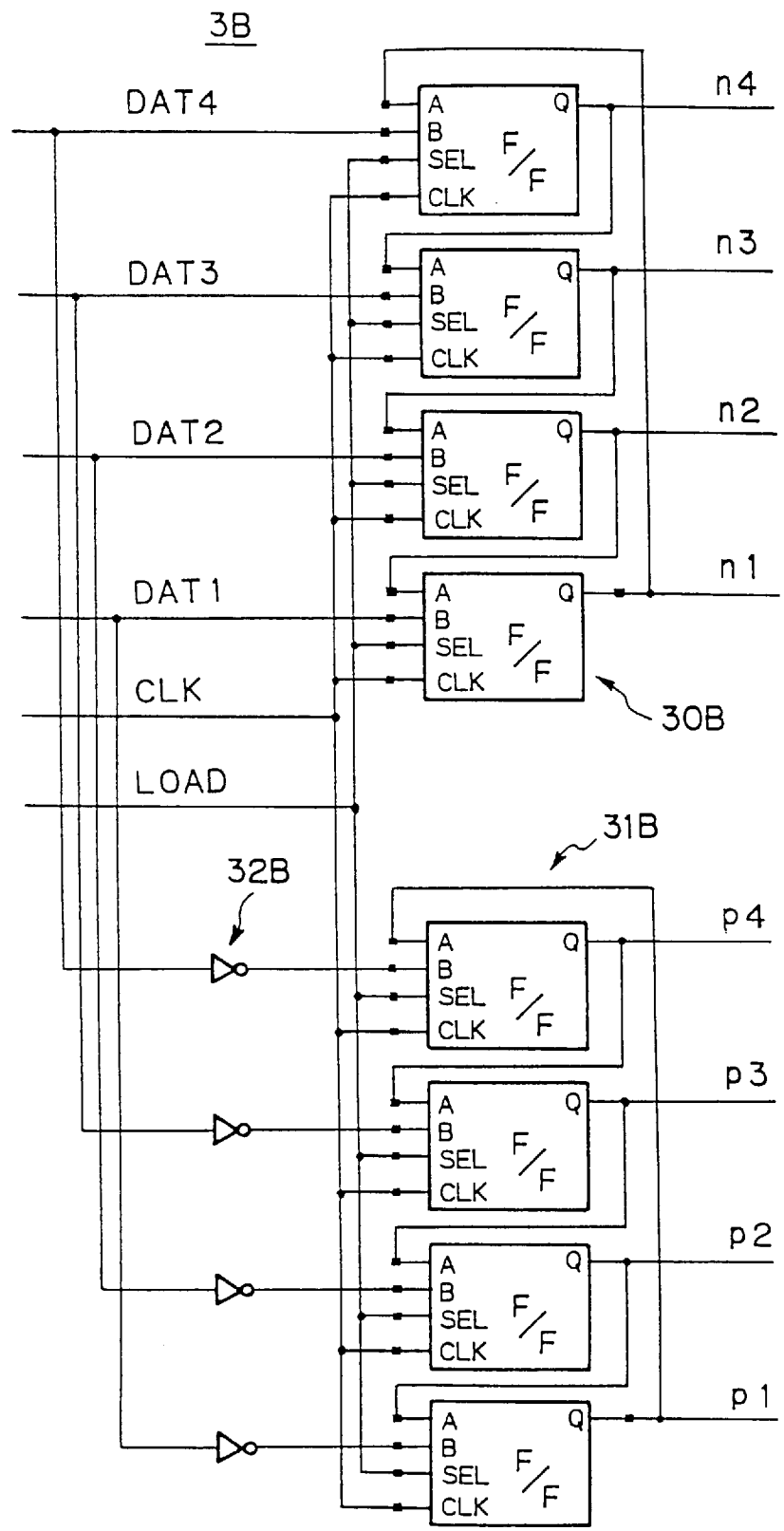
FIG. 4 is a circuit diagram showing in detail the bit rotator circuit included in the converter shown in FIG. 2.

FIG. 4 shows in detail the circuit 3B which comprises a group of inverting-side (n) flip-flops (F/Fs) 30B; a group of non-inverting-side (p) flip-flops (F/Fs) 31B; and a group of inverters 32B. The flip-flop group 30B comprises four flip-flops connected in a cyclic form, wherein each of the flip-flops receives an associated one of DAT1–4 at a terminal B, the clock input CLK (having a rising edge at the beginning of each sub-period as shown in FIG. 3) at a terminal CLK, and the LOAD signal (having a falling edge at the beginning of the main period, as shown in FIG. 3) at a terminal SEL, and produces an associated one of the rotated bit outputs n1–n4 at a terminal Q. Also, the each flip-flop has a terminal A which receives the Q output of the previous flip-flop in the cyclic loop (a loop from the uppermost F/F to the lowest F/F and then returning to the uppermost F/F) for the rotation according to the present invention. Explaining the operation of the flip-flop group 30B, each flip-flop in the group 30B, for example, the lowest flip-flop is triggered at a falling edge of the LOAD signal to be set to the value of an associated one of the DAT1–4, i.e., DAT1 at the triggered time, and thereafter is set to the Q output of the previous flip-flop in the cyclic loop, i.e., the upper flip-flop at a rising edge of the clock CLK. Each set value is generated at the Q terminal as n1. The other flip-flops operate in a similar manner. In this way, the rotated bit outputs n1–n4 are formed as shown in FIG. 3. The flip-flop group 31B differs from the group 30B only in that each of the flip-flops in the group 31B receives an associated one of DAT1–4 at a terminal B through an associated one of the group of inverters 32B. The operation of the flip-flop group 31B itself is completely the same as that of the group 30B. Thus, detailed explanation of the group 31B will be omitted. As can be seen also from FIGS. 5–7, the rotated bit outputs p1–p4 are equal to the inverted versions of the outputs n1–n4, respectively.

Referring now to FIGS. 5–7, the characteristic or nature of the rotated bit outputs will be explained below. In the case of S=(000) shown in FIG. 5, A is equal to zero, and the outputs n1–n4 are all "zeros", that is, in deactivated state during all the sub-periods. Therefore, the number of outputs having "ones", i.e., activated states during every sub-period is equal to the same value of zero, and the number of times each of the outputs n1–n4 falls into the activated state during the whole main period is also equal to the same value of zero. On the other hand, the outputs p1–p4 are all "ones" during all the sub-periods. Therefore, the number of activated outputs in each sub-period is equal to the same value of four (the number of deactivated outputs is equal to the same value of zero which is the same as the number of activated outputs in the n-side), while the number of times each output is activated during the whole main period is equal to the same value of four (the number of times of deactivation is equal to the same value of zero which is the same as the number of times of activation in the n-side). In the case of FIG. 5, no rotated bit output changes its state.

In the case of S=(010) in FIG. 6, two of the outputs n1–n4 have activated states "1" in any of the sub-periods. The number of activated outputs in each sub-period is equal to the same value of two, and the number of times of activation of each of the outputs n1–n4 during the whole main period is equal to the same value of two. The same is true of the outputs p1–p4. It should be noted that, for either the outputs n1–n4 or the outputs p1–p4, the number of outputs which change their states from one sub-period to another is two. The number of state changed outputs which is equal to two is common to any of the cases of S=(001)–(011).

The case of S=(100) is shown in FIG. 7, where A is equal to four (A=4). If this case is compared with the case of S=(000), each of the outputs in the former case has a value which is equal to the inversion of a value of the corresponding output in the latter case. Thus, there is not any difference in that the number of activated outputs in every sub-period and the number of times of activation during a main period present the same values, respectively, although the values for the n-side are interchanged with those for the p-side.

The rotated bit outputs described above are applied to the CMOS inverter/resistor serially coupled circuits, respectively, in the weighting circuit section 4B. Each of the serially coupled circuits produces an output voltage at zero volts when an associated rotated bit output is equal to "0" or has a deactivated state, and is activated to produce an output voltage at five volts when the associated output is "1". The summer 5B produces at the terminal 6B the difference between the sum of such output voltages of four CMOS inverter/resistor serially coupled circuits on the non-inverting side and the sum of such output voltages of four CMOS inverter/resistor serially coupled circuits on the inverting side.

Referring now to FIGS. 8–11, an experiment on the performance of the D/A converter B shown in FIG. 2 and the results thereof will be explained below. First, FIG. 8 shows a D/A converter system including the D/A converter of the present invention, wherein a ΣΔ modulator circuit 20 is connected to the input of the D/A converter B, and a low pass filter 7 to the output of the same. As a method of the experiment, a 16-bit digital input corresponding to a sine wave at 1 Khz was noise-shaped through the ΣΔ modulator 20 to be converted to a five-quantization-level four-bit digital signal which had quantization-noise in a so-called audio band (0–20 kHz) suppressed. The signal was then applied to the D/A converter B as DAT1–4 the output of which was next passed through the low pass filter 7. The derived analog output was subjected to waveform analysis. Advantages of the present invention was examined with the number of rotation b being equal to one (b=1). As a result, when there was a maximum relative error among the four CMOS inverter/resistor serially coupled circuits on the inverting side and non-inverting side, the level linearity and the noise immunity characteristics were considerably improved if the bit rotation according to the present invention was implemented.

Figure 9:
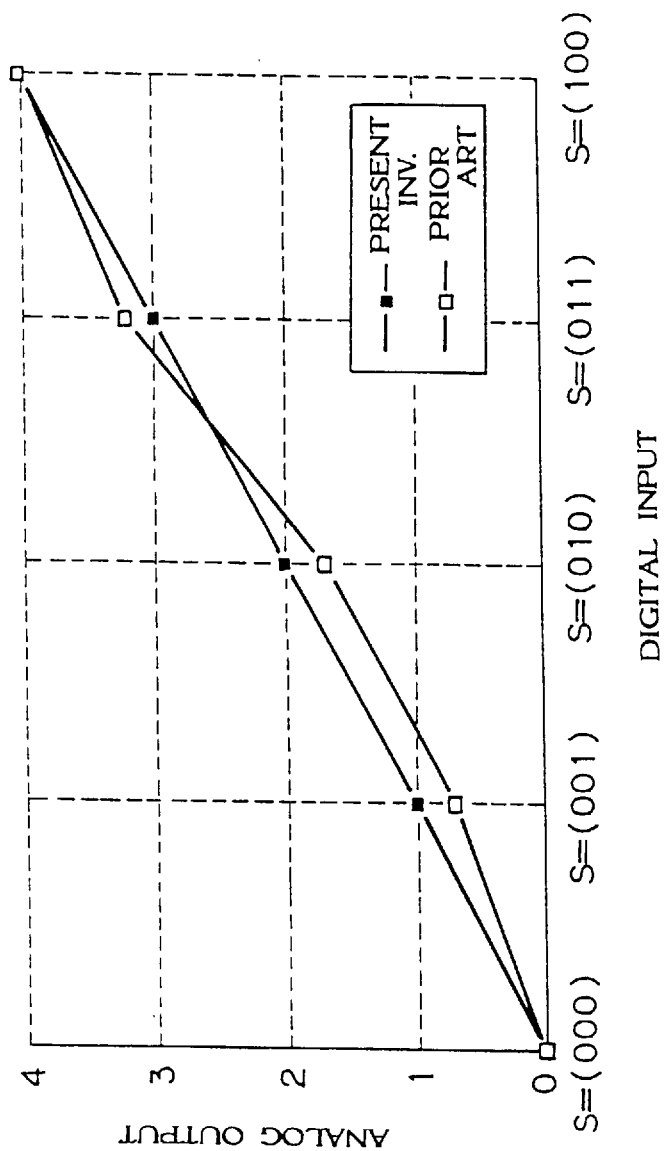
FIG. 9 is a graph showing the relationship between a digital input signal and an analog output of the D/A converter according to the present invention shown in FIG. 2 in comparison with a prior art.

Referring to FIGS. 9–11, advantages provided by the condition that "each of the weighting elements is activated the same number of times during the whole main period" will be explained in detail. FIG. 9 is a graph showing the input/output characteristic of a D/A converter, wherein the characteristic derived when an averaging according to the bit rotation method of the present invention was performed is shown in comparison with the characteristic when an averaging was performed without using the bit rotation method of the present invention. Data used for obtaining the characteristics are those shown in FIGS. 10 and 11, wherein only n1 through n4 are included. Also, the outputs of the four weighting elements are given individual errors, respectively.

Specifically, assume:

TABLE 1

| Weighting Element (which receives output n1) | error −2δ |
|---|---|
| Weighting Element (which receives output n2) | error −δ |
| Weighting Element (which receives output n3) | error +δ |
| Weighting Element (which receives output n4) | error +2δ |

Note that the error δ here is set to 0.4.

As can be seen from FIG. 10, the present invention enables a total average in Tm to present 0, 1, 2 and 3, thus perfectly ensuring the level linearity. Such a linearity as that of the present invention is not provided for the total average in Tm by the prior art which performs a different averaging from that of the present invention, as can be seen from FIG. 11. Apparently, a greater amount of harmonic distortion would appear in the analog output of the prior art example.

Referring now to FIGS. 12–17, a D/A converter C which is the second embodiment of the present invention, will be explained hereinafter. The converter C differs from the converter B of FIG. 2 in that a dummy bit generator 3C' and a dummy circuit 4C' are provided. The remaining portions, i.e., the circuits 3C, 4C and 5C are the same as corresponding ones in the converter B, and thus description thereof will be omitted.

First of all, the dummy bit generator and dummy circuit are provided in order that the converter C provides further improved noise immunity characteristics than the converter B. If every weighting element of the weighting circuit 4C generates noise when it is activated or deactivated, variations in amount of generated noise in between main periods may be a source for harmonic distortion. According to the present invention, therefore, the number of sources of noise are maintained constant in between main periods in order that such harmonic distortion is reduced.

Explaining in detail, FIG. 13 shows rotated bit outputs in the case of S=(000) wherein the same rotated bit outputs as shown in FIG. 5 are included. As can be seen, in the illustrated main period, the number of weighting elements within the weighting circuit 4C (excluding those in 4C') is zero which change in state from the activated state to the deactivated state or vice versa in between adjacent sub-periods. Therefore, there is no noise generated due to such state changes. On the other hand, in FIG. 14 showing the case of S=(010) (including the same ones as shown in FIG. 6), the number of weighting elements which change in state in between adjacent sub-periods is two on both the n-side and p-side, as indicated by arrows in each sub-period. The number is the same also when S is equal to (001) or (011). Finally, in the case of S=(100) shown in FIG. 15, the number of weighting elements which change in state in between adjacent sub-periods is zero, as is the case of S=(000). As will be understood from the foregoing, the number of sources of noise may change between a minimum value 0 and a maximum value 2 on both the n-side and p-side when the value of S changes.

Figure 12:
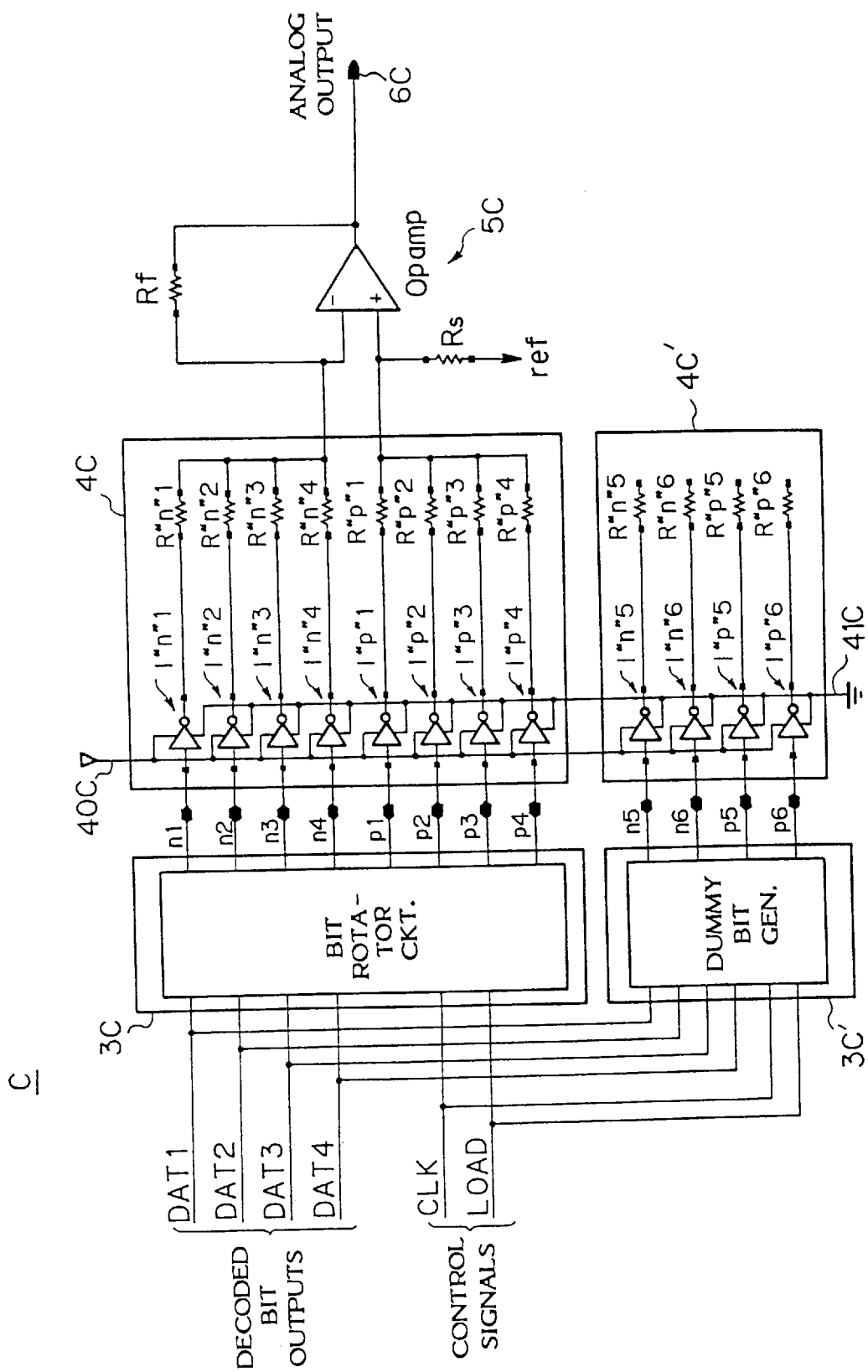
FIG. 12 is a block and schematic diagram of a D/A converter C which is the second more specific embodiment of the basic configuration shown in FIG. 1.

Therefore, the present invention ensures the maximum number or two of noise sources in each main period to achieve noise reduction by way of providing each of the n-side and p-side with the maximum number or two of dummy weighting elements, i.e., CMOS inverter/resistor serially coupled circuits I"n"5/R"n"5 and I"n"6/R"n"6 and CMOS inverter/resistor serially coupled circuits I"p"5/R"p"5 and I"p"6/R"p"6, as shown in the dummy circuit 4C' in FIG. 12. It should be noted that, although not shown in FIG. 2, each CMOS inverter is connected to a common power supply, i.e., to a common power supply line 40C and ground line 41C. For this reason, each CMOS inverter may affect the other CMOS inverters or the remaining circuit portions upon switching.

Figure 16:
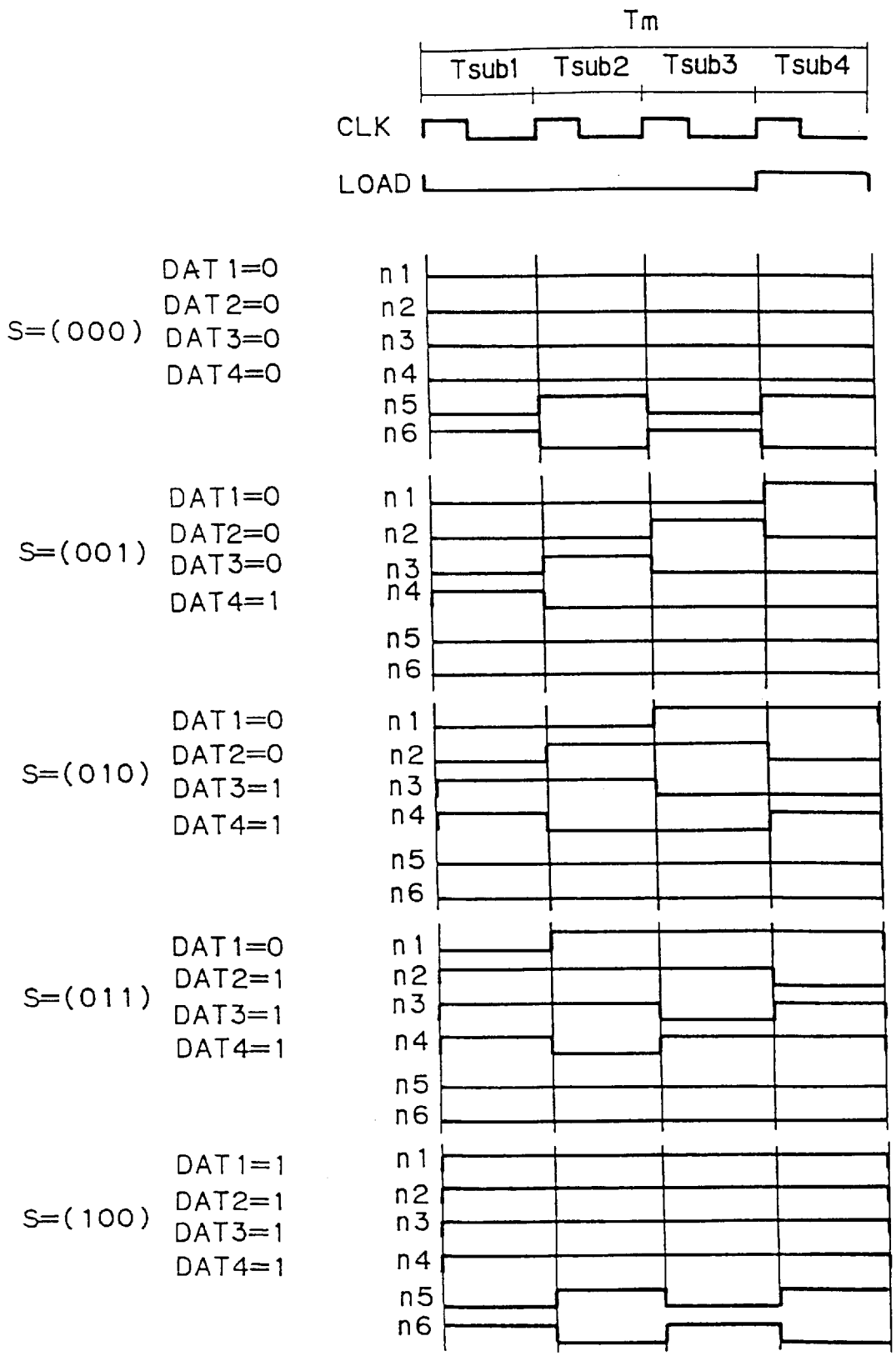
FIG. 16 is a diagram showing waveforms of rotated bit outputs produced by the bit rotator circuit included within the converter of FIG. 12.

In order to use the dummy weighting elements so as to ensure two noise sources on both the n-side and p-side irrespective of changes in the value of S, the dummy bit generator 3C' produces dummy bit outputs n5 and n6 and dummy bit outputs p5 and p6 as shown in FIG. 16. Note that the dummy bit outputs on the p-side are omitted from FIG. 16 since they are equal to the inverted versions of corresponding outputs on the n-side, respectively. In this way, the activation and deactivation of the dummy weighting elements are controlled, such that two state changes in between adjacent sub-periods are created only with the dummy weighting elements in the cases shown in FIGS. 13 and 15 while no such state change is created with the dummy elements in the case shown in FIG. 14.

Figure 17:
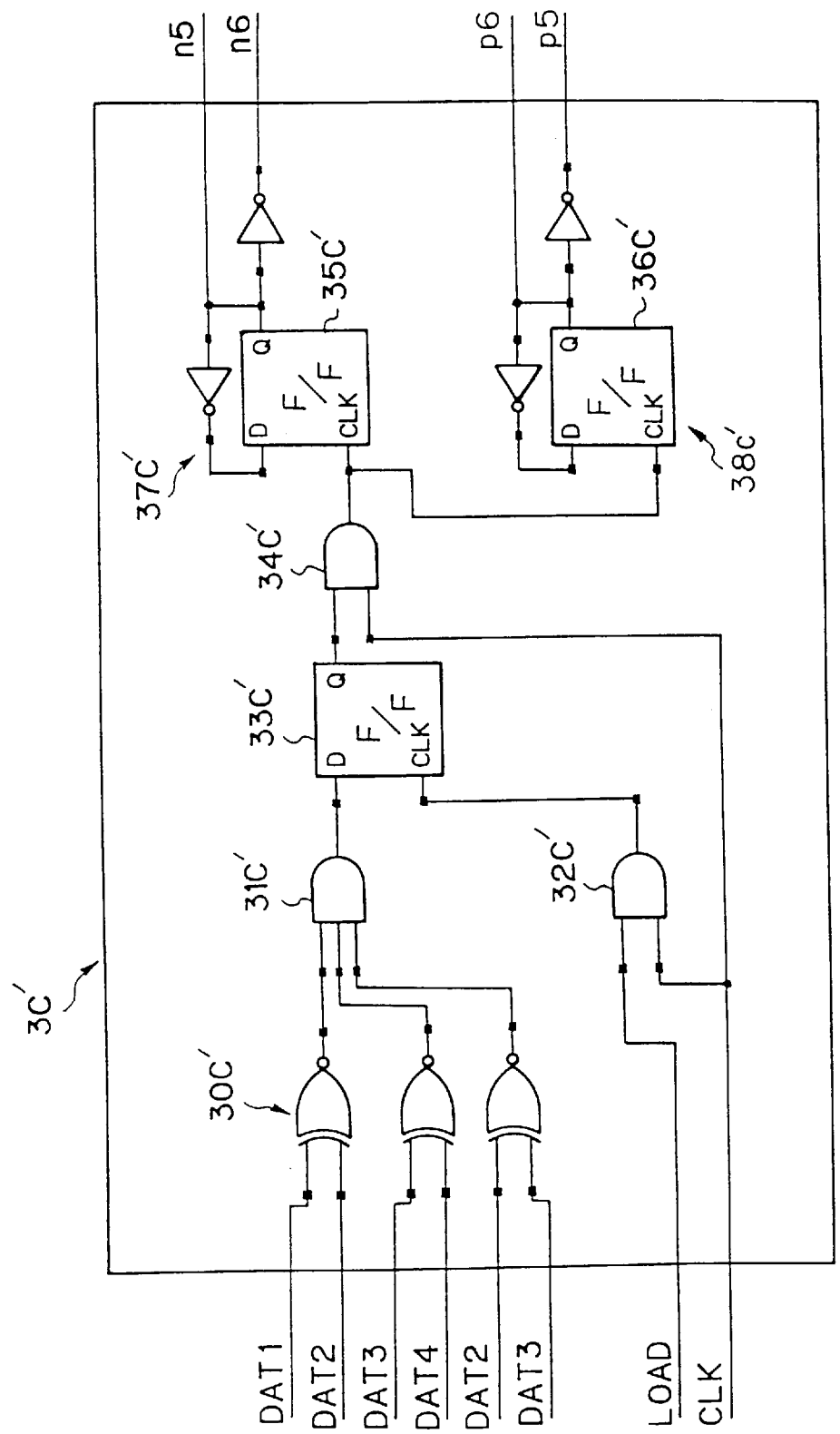
FIG. 17 is a circuit diagram showing in detail a dummy bit generator included in the converter shown in FIG. 12.

Now, referring to FIG. 17, the dummy bit generator 3C' will be explained. The circuit 3C' includes a group of three exclusive NOR (EX-NOR) gates 30C' which receive decoded bit outputs DAT1 and 2, DAT3 and 4 and DAT2 and 3, respectively; an AND gate 31C' which receives the outputs of the EX-NOR gates; an AND gate 32C' which is connected to receive a LOAD signal and a clock signal CLK; a flip-flop (F/F) 33C' which receives the output of the gate 31C' at a terminal D and the output of the gate 32C' at a terminal CLK; and an AND gate 34C' connected to receive the Q-output of the F/F and the clock signal CLK. The output of the gate 34C' is connected to identical circuit portions 37C' and 38C' which include flip-flops 35C' and 36C', respectively.

The gate group 30C' and the AND gate 31C' serve to distinguish the time when all the weighting elements on each of the n-side and p-side are activated or deactivated (the case of FIG. 13 or 15) from the other time (for example, the case of FIG. 14). The gate 31C' produces an output which has a logical "1" in the former case and a logical "0" in the latter case. The gate 32C' causes the output of the gate 31C' to be set into F/F 33C' at the beginning of every main period. Then, the AND gate 34C' allows the clock signal CLK to pass in the former case and prevents the same from passing in the latter case. When the subsequent F/F 35C' receives the clock signal from the gate 34C', the F/F responds to the clock to alternately output "1" and "0" at the Q-terminal which provide the dummy bit output n5. The dummy bit output n5 is inverted to provide the dummy bit output n6. When no clock signal is received, n5 and n6 each of which is either one of "1" and "0" are provided. Similarly to the circuit portion 37C', the circuit portion 38C' alternately outputs "1" and "0" at the Q-terminal in the above-mentioned former case, which provide the dummy bit output p5. The dummy bit output p6 is the inversion of p5. When no clock signal is received, the circuit portion 37C' outputs p5 and p6 each of which is either one of "1" and "0". In this way, the object of providing the aforementioned same number of noise sources is realized.

An experiment was also conducted on the above described D/A converter C, using the circuit configuration illustrated in FIG. 8. As a result, the harmonic distortion factor of an output sine wave was improved as compared with the case where the dummy circuit was not provided. Therefore, the converter C has further improved linearity and noise immunity characteristics.

Figure 18:
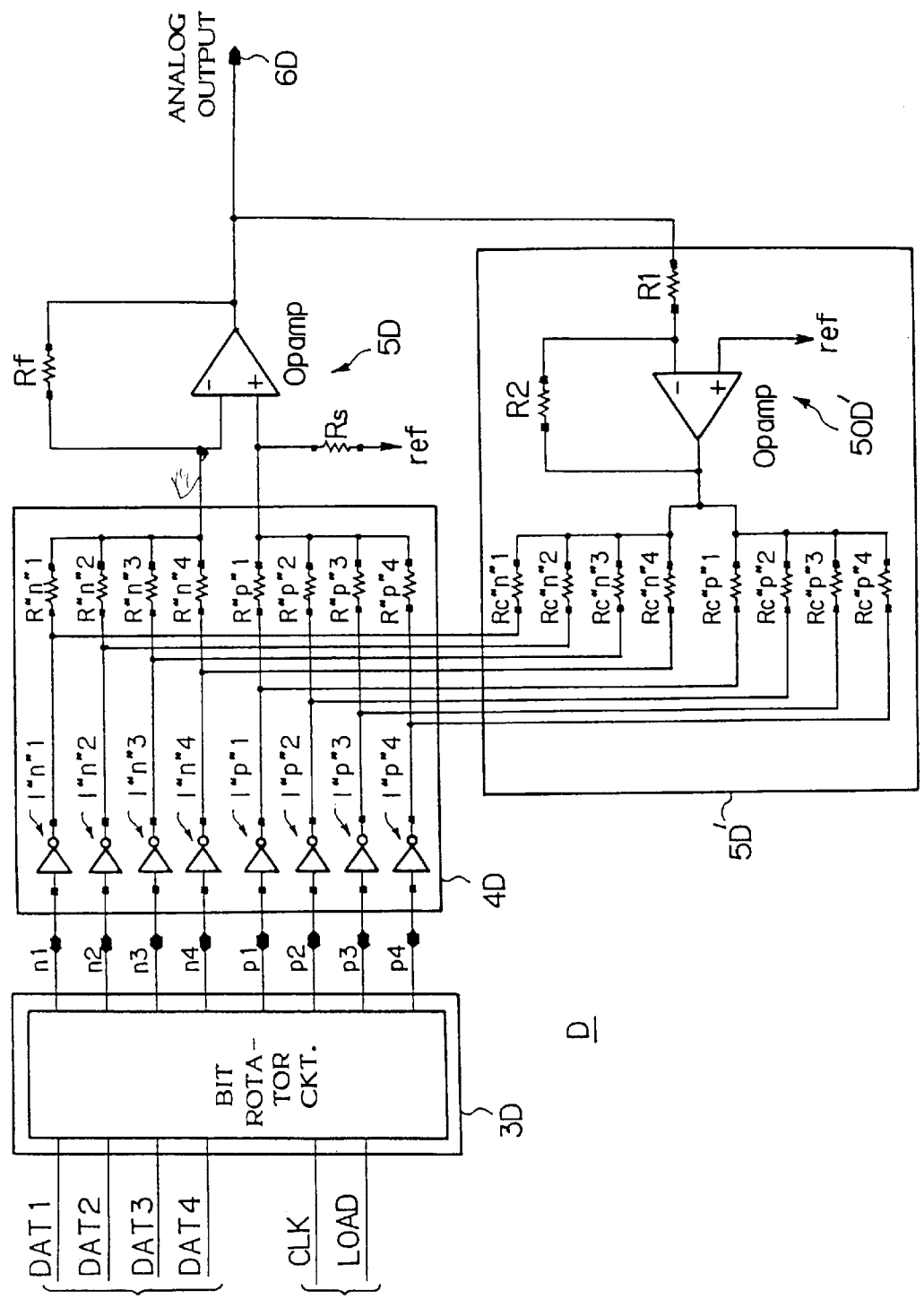
FIG. 18 is a block and schematic diagram of a D/A converter D which is the third more specific embodiment of the basic configuration shown in FIG. 1.

Referring now to FIG. 18, a D/A converter D which is the third embodiment of the present invention will be discussed. The converter D differs from the converter B of FIG. 2 in that an inverter output impedance matching circuit 5D' is additionally provided. The other portions, i.e., circuits 3D, 4D and 5D are the same as corresponding ones in the converter B, and thus explanation thereon will be omitted.

The circuit 5D' for matching output impedances of inverters is connected between the outputs of a pair of four CMOS inverters and the output of a differential summer 5D. The circuit 5D' includes an inverting amplifier 50D' and a pair of four output resistors Rc"n"1–4 and Rc"p"1–4. The output resistors respectively have substantially similar values to the resistors R"n"1–4 and R"p"1–4. The output resistors Rc"n"1–4 are connected between the respective outputs of four inverters I"n"1–I"n"4 and the output of the inverting amplifier, while the output resistors Rc"p"1–4 are connected between the respective outputs of four inverters I"p"1–I"p"4 and the output of the inverting amplifier. It should be understood that the equality between weighting elements including the equality between the output impedances of the CMOS inverters is important to the analog output characteristics of the converter. The output impedance of each of the inverters changes due to slight changes in the output voltage of the inverter. For this reason, on the inverting and non-inverting inputs of the differential summing amplifier, a total output impedance of the inverters I"n"1–I"n"4 and a total output impedance of the inverters I"p"1–I"p"4 may take slightly different values. For removing such slight output impedance difference, the matching circuit 5D' matches voltages at the inverting and non-inverting inputs of the summer 5D with an output voltage of the inverting amplifier 50D', thereby matching the total output impedances with each other.

Again, an experiment was conducted with the D/A converter D using the circuit configuration illustrated in FIG. 8. As a result, the harmonic distortion factor of an output sine waveform was improved in the case with the inverter output impedance matching circuit employed, as compared with the case without the same.

Figure 19:
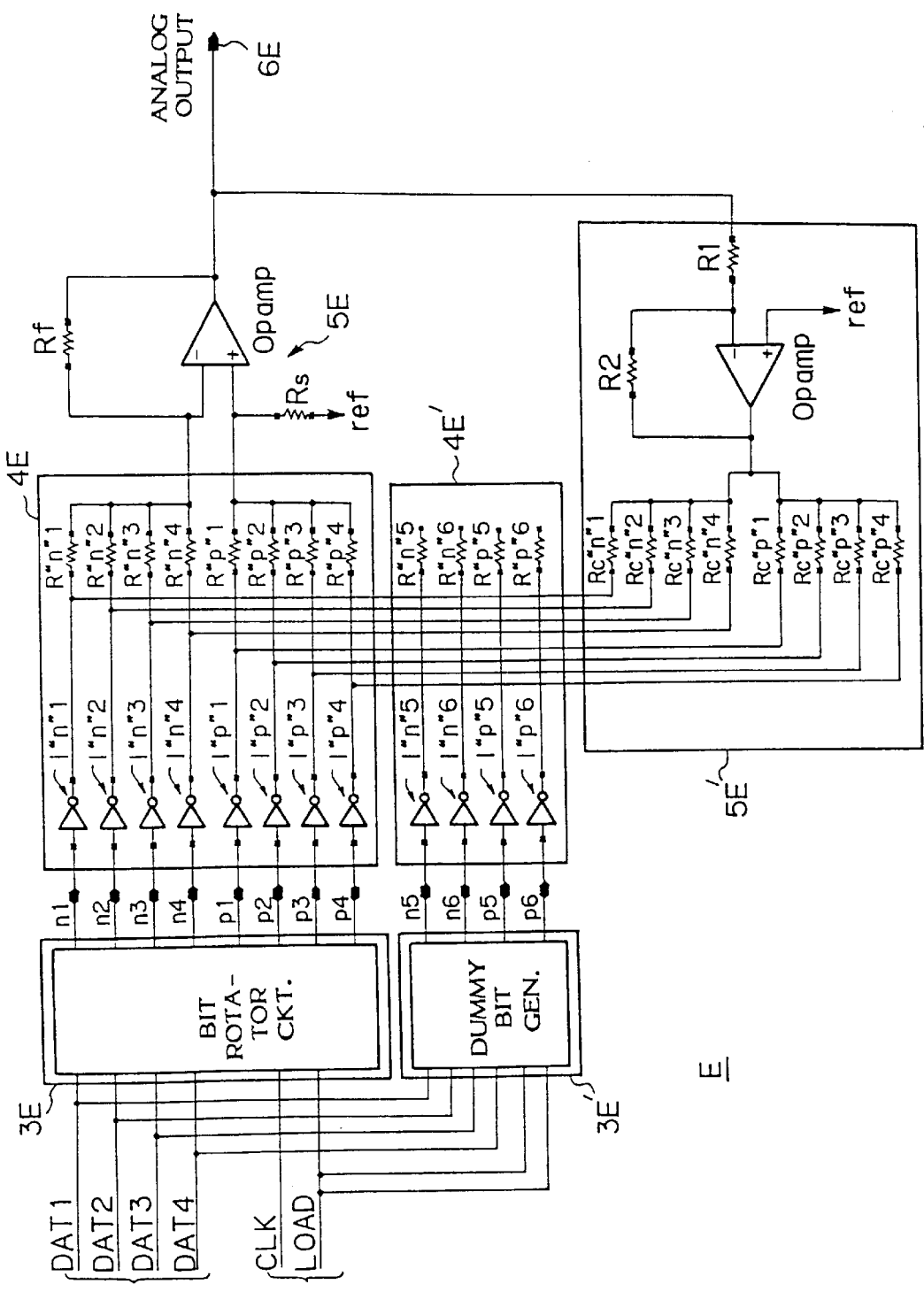
FIG. 19 is a block and schematic diagram of a D/A converter E which is the fourth more specific embodiment of the basic configuration of FIG. 1.

Next, referring to FIG. 19, a D/A converter E which is the fourth embodiment of the present invention is shown. The converter E differs from the converter B in FIG. 2 in that a dummy bit generator 3E', a dummy circuit 4E' and an inverter output impedance matching circuit 5E' are further provided. The remaining portions, i.e., circuits 3E, 4E and 5E are the same as corresponding ones of the converter B. Also, the dummy bit generator 3E' and the dummy circuit 4E' are the same as those 3C' and 4C' provided in the converter C in FIG. 12, and further the matching circuit 5E' is equivalent to the inverter output impedance matching circuit 5D' provided in the converter D shown in FIG. 18. Again, with the D/A converter E of FIG. 19, an experiment was performed using the circuit configuration shown in FIG. 8. The result is that the harmonic distortion factor of an output sine waveform was improved similarly to the converters C and D.

Now, various modifications to the foregoing embodiments will be described.

With reference to FIG. 20, a first modification to the first to fourth embodiments will be explained. Although the foregoing embodiments have been explained with the number of rotations b being equal to one, the number may be changed to be equal to two or more. Specifically, when an input digital signal changes between adjacent main periods, the linearity of an analog output at the change strongly depends on a degree of element equality between a weighting element activated in the last sub-period in a main period and a weighting element first activated in the next main period. Thus, the value of b may be increased as high as possible to shorten the duration of each sub-period such that the influence of the degree of element equality in between adjacent main-periods is relatively reduced. This results in advantages of improved analog performance.

FIG. 20 shows an example of the above modification which shows a table listing the rotated bit outputs n1–n4 and p1–p4 for the converter B, which is the first embodiment, wherein b is made equal to two (b=2). In this case, since the number M(=4) is not changed, the number of sub-periods k is eight (i.e., Tsub1–Tsub8). Then, the clock CLK needs to be increased to a double rate. As illustrated, the outputs n1–n4 on the inverting side and the outputs p1–p4 on the non-inverting side are consisted of values in the sub-periods Tsub1–Tsub4 which are also repeated in the sub-periods Tsub5–Tsub8. A similar experiment was performed for the converter B with this modification using the experiment circuit in FIG. 8. As a result, when there was a maximum relative error among CMOS inverter/resistor serially coupled circuits, the noise immunity characteristics were further improved than when b=1. A similar modification to that shown in FIG. 20 is possible to the converters C, D and E.

Figure 21:
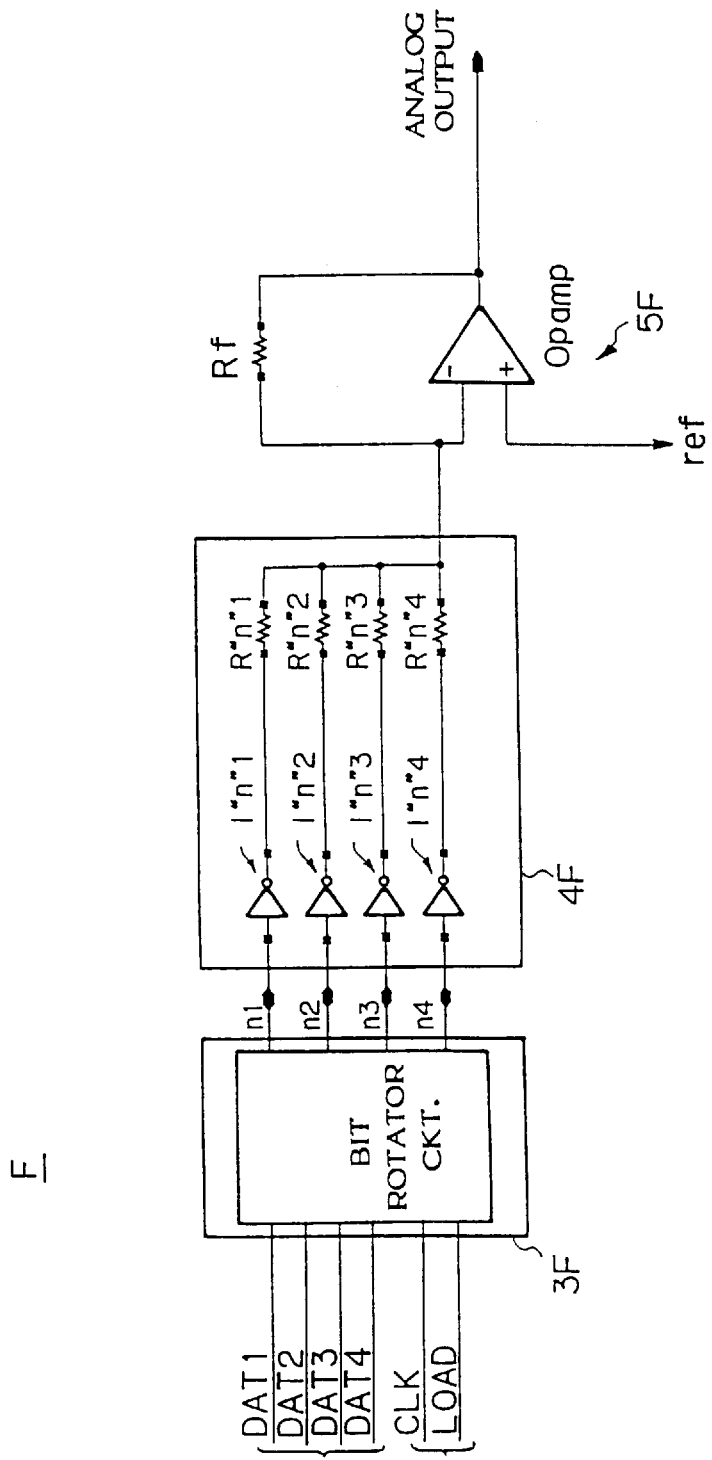
FIG. 21 is a block and schematic diagram of a D/A converter F which is formed by modifying the configuration of the first embodiment from a differential type to a non-differential type, for the purpose of illustrating modifications to the first and second embodiments of the present invention.

Next, with reference to FIG. 21, a modification to the foregoing first and second embodiments will be described. The first and second embodiments which have a differential type of configuration, may be changed to have a non-differential type of configuration. FIG. 21 shows a D/A converter F which comprises the converter B (i.e., the first embodiment) modified to a non-differential type. As is apparent from the drawing, circuits on the non-inverting (p) side are removed from a bit rotator circuit 3F and a weighting circuit 4F, and the output of the weighting circuit is connected only to the inverting side of a summer 5F. The converter of this configuration also sufficiently provides the advantages which are obtained by the bit-rotation averaging of the present invention. Similarly, the converter C (i.e., the second embodiment) may also be changed to a non-differential configuration by removing circuits on the non-inverting side, although not shown.

Finally, modifications of the bit rotation will be discussed. In the foregoing embodiments, the bit rotation is performed as shown in FIG. 6, for example, in such a manner that a bit "1" or "0" is shifted one by one in the direction from n4 (or p4) to n1 (or p1) and again to n4 (or p4). However, the direction or amount of the shifting can be modified by interchanging the rotated bit output values in the sub-period Tsub1 with those in the sub-period Tsub3. Important is that each of a plurality of weighting elements is activated an equal number of times (including zero) during a main period. As long as this condition is satisfied, the pattern of rotation of bits may be arbitrarily changed. Further, when the rotation is performed two or more times, the pattern of the first bit rotation may be made different from the pattern of a subsequent bit rotation.

According to the present invention described above, the converter characteristics of a digital-to-analog converter, i.e., the linearity and the noise immunity characteristics can be further improved. Also, the converter characteristics of a converter can be improved even if it is difficult to sufficiently maintain the uniformity or equality among individual weighting element devices, which is the most important performance factor for determining the converter characteristics, due to problems on the principle of operation of the devices, limit of manufacturing techniques, or restriction on cost (for example, a cost for trimming of resistors having dispersed values and a cost for extra chip area required to form elements larger for ensuring relative accuracy, in the case of an integrated circuit). Thus, required converter characteristics can be realized without using expensive trimming techniques which have been often employed in the manufacturing of digital-to-analog converters.

What is claimed is:

1. A digital-to-analog converter for converting a digital input signal to an analog output signal corresponding thereto in every main period of time, said main period being divided into a plurality of sub-periods of time, comprising:
    a) an input terminal for receiving said digital input signal;
    b) an output terminal for producing said analog output signal;
    c) weighting means including a plurality of weighting elements, each of said weighting elements being activated or deactivated by a weighting element control signal received thereby to produce a weighted output;
    d) combination means adapted to receive a plurality of said weighted outputs from said plurality of weighting elements of said weighting means for combining said plurality of weighted outputs to supply said analog output signal to said output terminal;
    e) decoder means for decoding said digital input signal received at said input terminal to produce a plurality of decoded signals, said plurality of decoded signals being operative to determine a combination of a number of weighting elements to be activated and a number of weighting elements to be deactivated within said plurality of weighting elements required to form said analog output signal; and
    f) rotator means connected to receive said plurality of decoded signals for producing a plurality of weighting element control signals from said plurality of decoded signals, said plurality of weighting element control signals being operative to activate or deactivate said plurality of weighting elements, respectively, in such a manner that the same number of weighting elements are activated in each of said plurality of sub-periods constituting a given main period and that each of said plurality of weighting elements is activated the same number of times during said given main period, wherein said plurality of weighting elements are designed to perform substantially equal amounts of weighting when activated and perform a zero amount of weighting when deactivated, a number M of said plurality of weighting elements being greater than a maximum decimal value A represented by said digital input signal, and a number of said plurality of sub-periods constituting said main period being equal to b×M, where b is any positive integer.

2. A digital-to-analog converter according to claim 1, wherein:
    when said b is equal to two or more, said rotator means repetitively produces said plurality of weighting element control signals produced in a first M number of sub-periods within a b×M number of sub-periods constituting said main period, in subsequent each M number of sub-periods.

3. A digital-to-analog converter according to claim 1, wherein said plurality of weighting elements of said weighting means are connected to a common power supply and wherein said digital-to-analog converter further includes dummy means connected to receive said decoded signals from said decode means, said dummy means comprises:
    a) a plurality of dummy weighting elements connected to said common power supply; and
    b) dummy control signal generator means connected to receive said decoded signals for generating in response thereto dummy weighting element control signals, said dummy weighting element control signals being operative to activate or deactivate said plurality of dummy weighting elements, respectively, in such a manner that a sum of a number of activated ones within said plurality of weighting elements and a number of activated ones within said plurality of dummy weighting elements is equal to a predetermined constant value over the whole period of digital-to-analog conversion.

4. A digital-to-analog converter according to claim 3, wherein:

each said dummy weighting element includes a CMOS inverter which receives said dummy weighting control signal and a resistor having an end connected to an output of said inverter, the other end of said resistor being open-circuited.

5. A digital-to-analog converter according to claim 3, wherein:

each said dummy weighting element includes a CMOS inverter which receives said dummy weighting element control signal, an output of said inverter being open-circuited.

6. A digital-to-analog converter according to claim 1, wherein:

each said weighting element includes a CMOS inverter which receives said weighting element control signal and a resistor having an end connected to an output of said inverter, the other end of said resistor being adapted to produce said weighted output.

7. A digital-to-analog converter according to claim 1, wherein:

each said weighting element is of a voltage source type.

8. A digital-to-analog converter according to claim 7, wherein:

said weighting element of voltage source type includes a CMOS inverter.

9. A digital-to-analog converter according to claim 1, wherein:

each said weighting element is of a current source type.

10. A digital-to-analog converter for converting a digital input signal to an analog output signal corresponding thereto in every main period of time, said main period being divided into a plurality of sub-periods of time, comprising:

a) an input terminal for receiving said digital input signal;

b) an output terminal for producing said analog output signal;

c) weighting means including a first set of weighting elements comprising a first plural number of weighting elements and a second set of weighting elements comprising a second plural number of weighting elements, each said weighting element being activated or deactivated by a weighting element control signal received thereby to produce a weighted output;

d) combination means having a first input for receiving a first set of said weighted outputs from said first set of weighting elements of said weighting means, and a second input for receiving a second set of said weighted outputs from said second set of weighting elements of said weighting means, said combination means being operative to differentially combine said first set of weighted outputs and said second set of weighted outputs to supply said analog output signal to said output terminal;

e) decode means for decoding said digital input signal received at said input terminal to produce a plurality of decoded signals, said plurality of decoded signals being operative to determine a combination of a number of weighting elements to be activated and a number of weighting elements to be deactivated within said plurality of weighting elements required to form said analog output signal; and f) rotator means connected to receive said plurality of decoded signals for producing a first set of a plurality of weighting element control signals for activating or deactivating said first set of weighting elements, respectively, and a second set of a plurality of weighting element control signals for activating or deactivating said second set of weighting elements, respectively, each of said first and second sets of said weighting element control signals being adapted such that the same number of weighting elements in an associated set of weighting elements are activated in each of said plurality of sub-periods constituting a given main period and that each of said plurality of weighting elements in the associated set is activated the same number of times during said given main period, wherein said first and second sets of weighting elements are designed to perform substantially equal amounts of weighting when activated and perform a zero amount of weighting when deactivated, a number M of the plurality of weighting elements in each of said first and second sets greater than a maximum decimal value A represented by said digital input signal, and a number of said plurality of sub-periods constituting said main period being equal to b×M, where b is any positive integer.

11. A digital-to-analog converter according to claim 10, wherein:

when said b is equal to two or more, said rotator means repetitively produces said first set of weighting element control signals produced in a first M number of sub-periods within a b×M number of sub-periods constituting said main period, in subsequent each M number of sub-periods and also repetitively produces said second set of weighting element control signals produced in the first M number of sub-periods, in the subsequent each M number of sub-periods.

12. A digital-to-analog converter according to claim 10, wherein said first and second sets of weighting elements of said weighting means are connected to a common power supply, and wherein said digital-to-analog converter further includes dummy means connected to receive said decoded signals from said decode means, said dummy means comprises:

a) a first set of dummy weighting elements comprising a plurality of dummy weighting elements connected to said common power supply, and a second set of dummy weighting elements comprising a plurality of dummy weighting elements connected to said common power supply; and b) dummy control signal generator means connected to receive said decoded signals for generating in response thereto a first set of dummy weighting element control signals for activating or deactivating said first set of dummy weighting elements, respectively, and a second set of dummy weighting element control signals for activating or deactivating said second set of dummy weighting elements, respectively, said first and second sets of dummy weighting element control signals being adapted such that a sum of a number of activated ones within said first set of weighting elements of said weighting means and a number of activated ones within said first set of dummy weighting elements is equal to a predetermined constant value over the whole period of digital-to-analog conversion and that a sum of a number of activated ones within said second set of weighting elements of said weighting means and a number of activated ones within said second set of dummy weighting elements is equal to a predetermined constant value over the whole period of the digital-to-analog conversion.

13. A digital-to-analog converter according to claim 12, wherein:

each said dummy weighting element includes a CMOS inverter which receives said dummy weighting control signal and a resistor having an end connected to an output of said inverter, the other end of said resistor being open-circuited.

14. A digital-to-analog converter according to claim 13, wherein:

said combination means comprises an operational amplifier having an inverting input forming said first input, a non-inverting input forming said second input, and an output connected to said output terminal;

said digital-to-analog converter including an output impedance matching circuit connected between said output terminal and the outputs of said CMOS inverters included in said first and second sets of weighting elements; and said output impedance matching circuit being operative to match an output impedance of a plurality of CMOS inverters constituting said first set of weighting elements with an output impedance of a plurality of CMOS inverters constituting said second set of weighting elements.

15. A digital-to-analog converter according to claim 12, wherein:

each said dummy weighting element includes a CMOS inverter which receives said dummy weighting element control signal, an output of said inverter being open-circuited.

16. A digital-to-analog converter according to claim 15, wherein:

said combination means comprises an operational amplifier having an inverting input forming said first input, a non-inverting input forming said second input, and an output connected to said output terminal;

said digital-to-analog converter including an output impedance matching circuit connected between said output terminal and the outputs of said CMOS inverters included in said first and second sets of weighting elements; and said output impedance matching circuit being operative to match an output impedance of a plurality of CMOS inverters constituting said first set of weighting elements with an output impedance of a plurality of CMOS inverters constituting said second set of weighting elements.

17. A digital-to-analog converter according to claim 10, wherein:

each said weighting element includes a CMOS inverter which receives said weighting element control signal and a resistor having an end connected to an output of said inverter, the other end of said resistor being adapted to produce said weighted output.

18. A digital-to-analog converter according to claim 17, wherein:

said combination means comprises an operational amplifier having an inverting input forming said first input, a non-inverting input forming said second input, and an output connected to said output terminal;

said digital-to-analog converter including an output impedance matching circuit connected between said output terminal and the outputs of said CMOS inverters included in said first and second sets of weighting elements; and said output impedance matching circuit being operative to match an output impedance of a plurality of CMOS inverters constituting said first set of weighting elements with an output impedance of a plurality of CMOS inverters constituting said second set of weighting elements.

19. A digital-to-analog converter for converting a digital input signal to an analog output signal corresponding thereto in every main period of time, said main period being divided into a plurality of sub-periods of time, comprising:

(a) an input terminal for receiving said digital input signal;

(b) an output terminal for producing said analog output signal;

(c) a weighting network including a plurality of weighting elements, each of said weighting elements being activated or deactivated by a weighting element control signal received thereby to produce a weighted output;

(d) a combination circuit adapted to receive a plurality of said weighted outputs from said plurality of weighting elements of said weighting circuit and combine said plurality of weighted outputs to supply said analog output signal to said output terminal;

(e) a decoder decoding said digital input signal received at said input terminal to produce a plurality of decoded signals, said plurality of decoded signals being operative to determine a combination of a number of weighting elements to be activated and a number of weighting elements to be deactivated within said plurality of weighting elements required to form said analog output signal; and (f) a rotator circuit connected to receive said plurality of decoded signals, said rotator circuit producing a plurality of weighting element control signals from said plurality of decoded signals, said plurality of weighting element control signals being operative to activate or deactivate said plurality of weighting elements, respectively, in such a manner that the same number of weighting elements are activated in each of said plurality of sub-periods constituting a given main period and that each of said plurality of weighting elements is activated the same number of times during said given main period, wherein said Plurality of weighting elements are designed to perform substantially equal amounts of weighting when activated and perform a zero amount of weighting when deactivated, a number M of said plurality of weighting elements greater than a maximum decimal value A represented by said digital input signal, and a number of said plurality of sub-periods constituting said main period being equal to b×M, where b is any positive integer.

20. A digital-to-analog converter for converting a digital input signal to an analog output signal corresponding thereto in every main period of time, said main period being divided into a plurality of sub-periods of time, comprising:

a) an input terminal for receiving said digital input signal;

b) an output terminal for producing said analog output signal;

c) a weighting network including a first set of weighting elements comprising a first plural number of weighting elements and a second set of weighting elements comprising a second plural number of weighting elements, each said weighting element being activated or deactivated by a weighting element control signal received thereby to produce a weighted output;

d) a combination circuit having a first input for receiving a first set of said weighted outputs from said first set of weighting elements of said weighting network, and a second input for receiving a second set of said weighted outputs from said second set of weighting elements of said weighting network, said combination circuit being operative to differentially combine said first set of weighted outputs and said second set of weighted outputs to supply said analog output signal to said output terminal;

e) a decoder decoding said digital input signal received at said input terminal to produce a plurality of decoded signals, said plurality of decoded signals being operative to determine a combination of a number of weighting elements to be activated and a number of weighting elements to be deactivated within said plurality of weighting elements required to form said analog output signal; and f) a rotator circuit connected to receive said plurality of decoded signals for producing a first set of a plurality of weighting element control signals for activating or deactivating said first set of weighting elements, respectively, and a second set of a plurality of weighting element control signals for activating or deactivating said second set of weighting elements, respectively, each of said first and second sets of said weighting element control signals being adapted such that the same number of weighting elements in an associated set of weighting elements are activated in each of said plurality of sub-periods constituting a given main period and that each of said plurality of weighting elements in the associated set is activated the same number of times during said given main period, wherein each of said weighting elements includes a CMOS inverter which receives said weighting element control signal and a resistor having an end connected to an output of said inverter, the other end of said resistor being adapted to produce said weighted output, wherein said combination circuit comprises a first operational amplifier having an inverting input forming said first input, a non-inverting input forming said second input, and an output connected to said output terminal, said digital-to-analog converter including an output impedance matching circuit connected between said output terminal and the outputs of said CMOS inverters included in said first and second sets of weighting elements, said output impedance matching circuit including a second operational amplifier having an input coupled to the output of said first operational amplifier, a first group of resistors each coupled between an output of the second operational amplifier and an output of a corresponding CMOS inverter in the first set of weighting elements, and a second group of resistors each coupled between the output of the second operational amplifier and an output of a corresponding CMOS inverter in the second set of weighting elements, and said output impedance matching circuit being operative to match an output impedance of a plurality of CMOS inverters constituting said first set of weighting elements with an output impedance of a plurality of CMOS inverters constituting said second set of weighting elements.

* * * * *